(12) United States Patent
Park et al.

(10) Patent No.: US 7,816,858 B2
(45) Date of Patent: Oct. 19, 2010

(54) DISPLAY DEVICE AND METHOD OF FABRICATING THE SAME

(75) Inventors: Kyong-tae Park, Uijeongbu-si (KR); Beohm-rock Choi, Seoul (KR); Hoon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 671 days.

(21) Appl. No.: 11/733,827

(22) Filed: Apr. 11, 2007

(65) Prior Publication Data

US 2007/0235791 A1    Oct. 11, 2007

(30) Foreign Application Priority Data

Apr. 11, 2006    (KR) .................. 10-2006-0032880

(51) Int. Cl.
*H01L 51/52*    (2006.01)
(52) U.S. Cl. ........................ 313/504; 428/690
(58) Field of Classification Search .............. 313/504; 428/690
See application file for complete search history.

(56) References Cited

U.S. PATENT DOCUMENTS

| | | | |
|---|---|---|---|
| 2003/0080678 A1* | 5/2003 | Kim et al. | 313/504 |
| 2004/0135496 A1* | 7/2004 | Park et al. | 313/504 |
| 2005/0243234 A1* | 11/2005 | Jung | 349/43 |

FOREIGN PATENT DOCUMENTS

| | | |
|---|---|---|
| JP | 2000058271 | 2/2000 |
| JP | 2001102168 | 4/2001 |
| JP | 2003332043 | 11/2003 |

* cited by examiner

*Primary Examiner*—Nimeshkumar D Patel
*Assistant Examiner*—Mary Bowman
(74) *Attorney, Agent, or Firm*—Cantor Colburn LLP

(57) ABSTRACT

A display device and a method of fabricating the same, the display device including a first substrate having a display region, a light emitting layer disposed within the display region, a first voltage pad disposed outside the display region, on the first substrate outside of the display region and supplying a predetermined voltage to the display region, a second substrate provided above the first substrate and corresponding to the display region, a second voltage pad disposed on a surface of the first or second substrate provided opposite to a direction of light emitted from the light emitting layer and a flexible film electrically connecting the first voltage pad and the second voltage pad.

22 Claims, 13 Drawing Sheets

DISPLAY DEVICE AND METHOD OF FABRICATING THE SAME

This application claims priority to Korean Patent Application No. 2006-0032880, filed on Apr. 11, 2006, and all the benefits accruing therefrom under 35 U.S.C. §119, the contents of which are incorporated herein by reference in its entirety.

BACKGROUND OF THE INVENTION

1. Field of the Invention

The present invention relates to a display device and a method of fabricating the same, and more particularly, to a display device and a method of fabricating the same, to which a driving voltage or a common voltage is applied.

2. Description of the Related Art

Recently, an organic light emitting display ("OLED") device has attracted attention and interest in the industry of flat panel display devices because of its low power consumption, light weight, slim shape, wide view angle, short response time, and the like. An OLED substrate is mounted with a plurality of thin film transistors for driving the OLED device. The thin film transistor has first and second electrodes to provide electrons and holes. When voltage is applied between two electrodes, the holes and the electrons are combined into excitons. When the excitons are transited from an excited state to a ground state within a light emitting layer sandwiched between two electrodes, light is emitted. Thus, the OLED device controls the emitted light to display images.

In the OLED substrate, one pixel includes a switching transistor provided around an intersection made by a gate line and a data line, and a driving transistor connected to a driving voltage line for applying a driving voltage. Further, the OLED substrate is provided with a voltage pad to supply a common voltage applied to the first or second electrode and to supply the driving voltage to the driving voltage line.

To accomplish a wide screen and a high resolution of the display device, the number of pixels should be increase. As the number of pixels increases, the common voltage and the driving voltage are not likely to be uniformly or smoothly supplied.

BRIEF SUMMARY OF THE INVENTION

An exemplary embodiment provides a display device and a method of fabricating the same, in which a driving voltage or a common voltage is smoothly supplied and thus brightness is uniform.

An exemplary embodiment provides a display device including a first substrate having a display region, a light emitting layer formed within the display region, a first voltage pad formed outside the display region, on the first substrate outside of the display region and supplying a predetermined voltage to the display region, a second substrate provided above the first substrate and corresponding to the display region, a second voltage pad formed on one of the first or second substrate opposite to a direction of light emitted from the light emitting layer and on a surface of the opposite substrate that is opposite to the direction of light emitted from the light emitting layer and a flexible film electrically connecting the first voltage pad and the second voltage pad.

In an exemplary embodiment, the display device further includes an anistropic conductive film provided between the flexible film and the first voltage pad and the flexible film and the second voltage pad.

In an exemplary embodiment the display device further includes a passivation layer formed on a portion of the second voltage pad.

In an exemplary embodiment the second voltage pad includes an opening pattern.

In an exemplary embodiment the first voltage pad is plurally provided, and a voltage having a first level is applied a portion of the first voltage pads and a voltage having a second level different from the first level is applied a remaining portion of the first voltage pads.

In an exemplary embodiment the first voltage pad includes a first common voltage pad to which a common voltage having the first level is applied, and a first driving voltage pad to which a driving voltage having the second level is applied.

In an exemplary embodiment the second voltage pad includes a second common voltage pad connected to the first common voltage pad, and a second driving voltage pad connected to the first driving voltage pad.

In an exemplary embodiment the display device further includes a driving voltage line formed within the display region. The first driving voltage pad is connected to the driving voltage line.

In an exemplary embodiment the display device further includes a common electrode formed throughout the display region. The first common voltage pad is connected to the common electrode.

In an exemplary embodiment the display device further includes a blocking layer interposed between the common electrode and the second substrate.

An exemplary embodiment provides a display device including a first substrate including a display region, a light emitting layer formed within the display region, at least two first voltage pads formed on the first substrate, outside of the display region and supplying a predetermined voltage to the display region, a second substrate provided above the first substrate and corresponding to the display region, a second voltage pad formed on a surface of the second substrate opposite to a direction of light emitted from the light emitting layer and a flexible film connecting the first voltage pads and the second voltage pad.

In an exemplary embodiment the display device further includes an anistropic conductive film provided between the flexible film and the first voltage pads and the flexible film and the second voltage pad.

In an exemplary embodiment the second voltage pad is formed on a surface of the second substrate which does not face the first substrate.

In an exemplary embodiment the display device further includes a passivation layer formed on a portion of the second voltage pad.

An exemplary embodiment provides a display device including a first substrate including a first surface including a display region, a light emitting layer formed within the display region, at least two first voltage pads disposed on the first substrate, outside of the display region and supplying a predetermined voltage to the display region, a second voltage pad formed on a second surface of the first substrate opposite to the first surface, a flexible film electrically connecting the first voltage pads and the second voltage pad and a second substrate provided above the first substrate and corresponding to the display region.

In an exemplary embodiment the display device further includes a power supply outputting voltage supplied to the first voltage pads, a data line formed within the display region, a plurality of data drivers mounted outside of the display region and applying data voltage to the data line, and a power supply flexible film connecting the first voltage pad and the power supply. The power supply flexible film includes a power supply region having a first connection part connected to the power supply, a second connection part extended from the first connection part and contacting the first voltage pad, and a third connection part bent from the second connection part and contacting the second voltage pad, and a driver region connecting the data drivers and the power supply.

In an exemplary embodiment the second connection part and the driver region are formed to have a double-layered structure.

An exemplary embodiment provides a method of fabricating a display device, the method including forming a first substrate including a display region having a light emitting layer and a first voltage pad supplying a predetermined voltage to the display region, forming a second voltage pad on a first surface of a second substrate and forming a passivation layer on the second voltage pad, forming a blocking layer on the first substrate or a second surface of the second substrate, hardening the blocking layer after adhering the second substrate onto the display region of the first substrate, and connecting the first voltage pad with the second voltage pad through a flexible film.

In an exemplary embodiment the first voltage pad includes a first common voltage pad to which a common voltage is applied, and a first driving voltage pad to which a driving voltage is applied. The second voltage pad includes a second common voltage pad connected to the first common voltage pad, and a second driving voltage pad connected to the first driving voltage pad.

An exemplary embodiment provides a method of fabricating a display device, the method including forming a display region having a plurality of transistors and a first voltage pad supplying a predetermined voltage to the display region on a first surface of a first substrate, forming a second voltage pad on a second surface of the first substrate and a passivation layer on the second voltage pad, forming a light emitting layer on the display region, forming a blocking layer on the first surface of the first substrate having the light emitting layer and at least one surface of the second substrate, hardening the blocking layer after adhering the second substrate onto the display region of the first substrate, and connecting the first voltage pad with the second voltage pad through a flexible film.

In an exemplary embodiment the connecting the first voltage pad with the second voltage pad includes forming an anisotropic conductive film on the first voltage pad and the second voltage pad, and applying a force to the flexible film after spreading the flexible film on the anisotropic conductive film.

BRIEF DESCRIPTION OF THE DRAWINGS

The above and/or other aspects and advantages of the present invention will become apparent and more readily appreciated from the following description of the exemplary embodiments, taken in conjunction with the accompanying drawings of which.

DETAILED DESCRIPTION OF THE INVENTION

Figure 1:
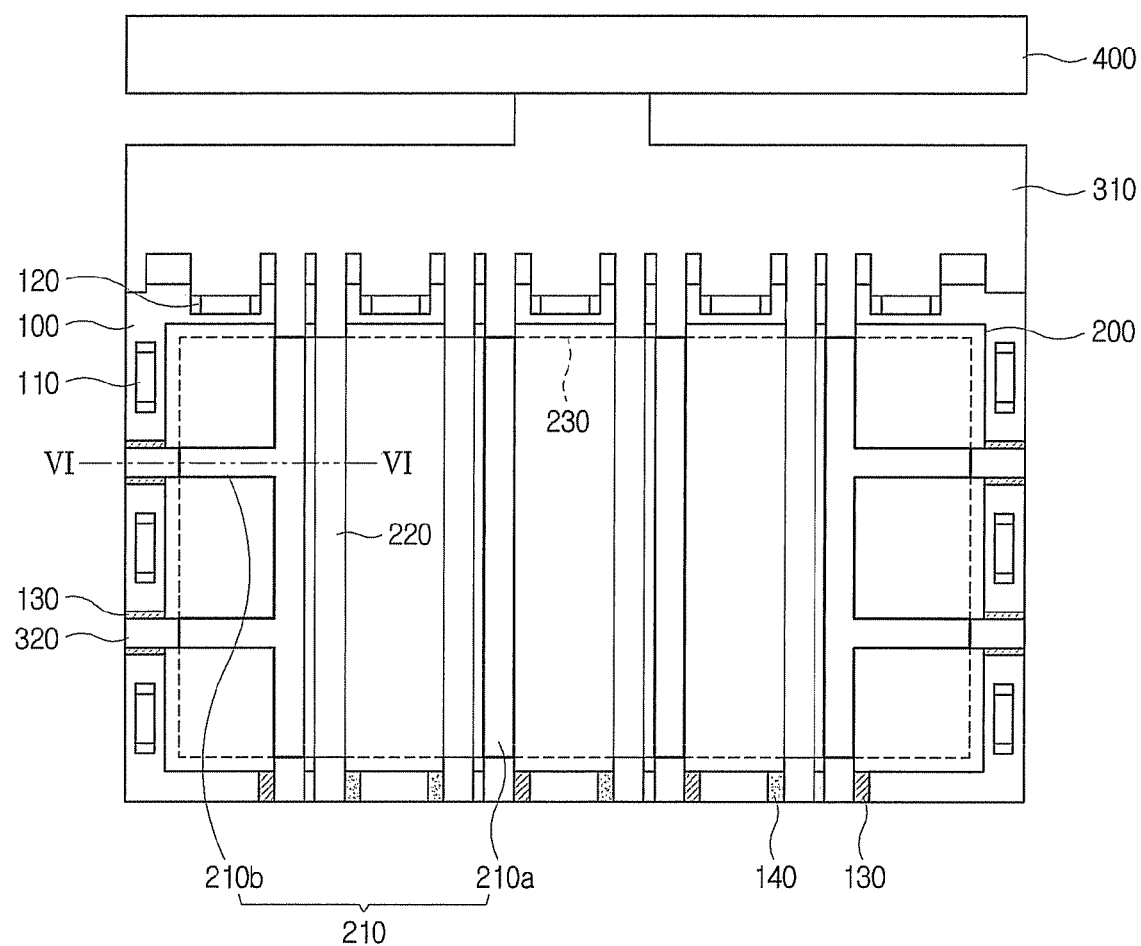
FIG. 1 is a schematic view of an exemplary embodiment of a display device according to the present invention.

Reference will now be made in detail to exemplary embodiments of the present invention, examples of which are illustrated in the accompanying drawings, wherein like reference numerals refer to like elements throughout, and repetitive descriptions will be avoided as necessary.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below", "lower", "under," "above", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

Figure 2:
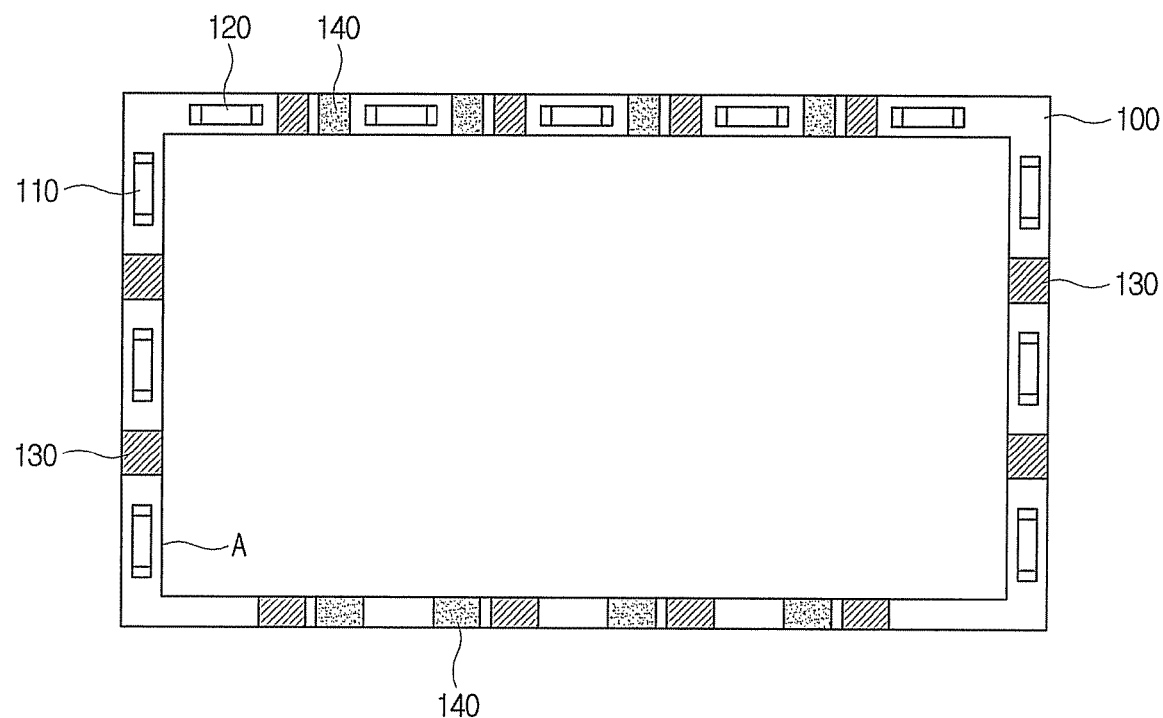
FIG. 2 is a schematic view of an exemplary embodiment of a first substrate according to the present invention.
Figure 3:
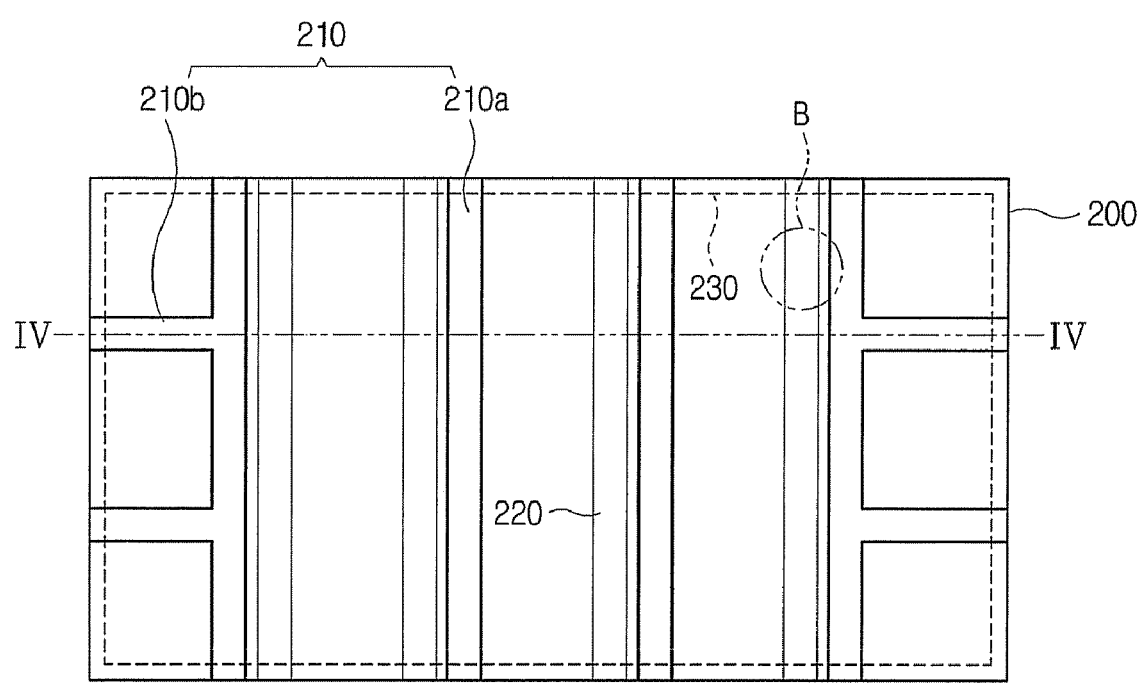
FIG. 3 is a schematic view of an exemplary embodiment of a second substrate according to the present invention.

FIG. 1 is a schematic view of an exemplary embodiment of a display device according to the present invention, FIG. 2 is a schematic view of an exemplary embodiment of a first substrate according to the present invention, and FIG. 3 is a schematic view of an exemplary embodiment of a second substrate according to the present invention.

As shown therein, a display device includes a first substrate 100 having a display region 'A', a second substrate 200 formed above the first substrate 100 in correspondence to the display region 'A', a plurality of first voltage pads 130 and 140 formed on the first substrate 100, a plurality of second voltage pads 210 and 220 formed on the second substrate 200, and flexible films 310 and 320 electrically connecting the first voltage pads 130 and 140 with the second voltage pads 210 and 220. The flexible films 310 and 320 are flexible and may include a flexible printed circuit ("FPC"). As used herein, "correspondence" and "corresponding" is considered as corresponding or being commensurate in shape, size of positional placement relative to another element.

Further, the display device includes gate and data drivers 110 and 120, respectively, provided on the first substrate 100 outside of the display region 'A', and a power supply 400 supplying various voltages to the gate and data drivers 110 and 120 and to the first voltage pads 130 and 140. As in the illustrated embodiment, the power supply 400 is placed on one side of the first substrate 100, where the data driver 120 is formed, and connected with the flexible film 310.

FIG. 2 shows the first substrate 100 before the second substrate 200 and the power supply 400 are coupled thereto. The substantially rectangular display region 'A' is formed to include a gate line (not shown), a data line (not shown) and a driving voltage line (not shown) extending perpendicularly to the gate line, and a plurality of substantially rectangular pixels (not shown) defined by an intersection of the gate line, and the data line and the driving voltage line. Further, a light emitting element (not shown) including a light emitting layer (not shown) is formed on each pixel.

Outside the display region 'A', e.g., on one side of a non-display region, or in the peripheral region, the gate driver 110 connected to an end of the gate line and the data driver 120 connected to an end of the data line are formed. A plurality of the gate drivers 110 may be disposed substantially symmetrically along opposing short edges (e.g., transverse sides) of the display region 'A' and in the peripheral region. The display region 'A' is interposed between the plurality of gate drivers, such as between a first plurality (e.g., on the left of the non-display region) and a second plurality (e.g., on the right of the non-display region).

A plurality of data drivers 120 is formed along a long edge, such as along one long edge (e.g., longitudinal side), of the display region 'A'. The gate driver 110 and the data driver 120 apply various driving signals from the outside to the gate line and the data line, respectively. In the illustrated embodiment, the gate driver 110 and the data driver 120 are mounted on the first substrate 100 in the form of chip on glass ("COG"). The gate line and the data line within the display region 'A' are extended toward an outer circumference of the display region 'A' and connected to the gate driver 110 and the data driver 120, respectively. In a connection area, there may be formed a gate fan-out part (not shown) in which intervals between the extended gate lines become narrower, and a data fan-out part (not shown) in which intervals between the extended data lines become narrower.

In the non-display region are formed the first voltage pads 130 and 140, which include a first common voltage pad 130 electrically connected to a common electrode 20 (refer to FIG. 6) and a first driving voltage pad 140 electrically connected to an end part of the driving voltage line. The display region 'A' has a substantially rectangular shape similar to the shape of the first substrate 100, and the voltage pads 130 and 140 are formed along the edges, e.g., four sides of the display region 'A'.

The first common voltage pads 130 are formed between every pair of adjacent gate drivers 110 and every pair of adjacent data drivers 120. The first common voltage pages 130 are substantially symmetrically formed at opposing sides of the first substrate 100 leaving the display region 'A' therebetween. The first common voltage pad 130 is connected to the common electrode 20 and applies the common voltage from the outside to the common electrode. In exemplary embodiments, the common electrode 20 and the first common voltage pad 130 may be directly connected with each other, or may be connected through a bridge electrode (not shown). The bridge electrode may include indium tin oxide ("ITO") or indium zinc oxide ("IZO").

A plurality of driving voltage pads 140 is disposed at edges of the first substrate 100 in the peripheral non-display region. A first portion of the first driving voltage pads 140 are formed between adjacent pairs the data drivers 120 as illustrated in FIG. 2, such as along a first longitudinal side. A second portion of the driving voltage pads 140 are disposed spaced at predetermined intervals along an opposite edge from the first longitudinal side where the data drivers 120 are formed and across the display region 'A'. The second portion of the driving voltage pads 140 alternate with the first common voltage pads 130 across a second longitudinal side of the first substrate 100.

In exemplary embodiments, the first driving voltage pad 140 is made of a data metal material forming the data line, and the first common voltage pad 130 is made of a gate metal material forming the gate line. The first voltage pads 130 and 140 may include any of a number of conductive materials as well as various metal materials of the gate or data metal material. In one exemplary embodiment, the first voltage pads 130 and 140 are made of ITO or IZO.

The shape and the configuration of the first voltage pads 130 and 140 are not limited to those of the illustrated embodiment. In alternative embodiments, according to the sizes of the display device, the first voltage pads may be formed along a partial edge of the display region 'A', and may have substantially a bar shape being extended not only between the drivers 110 and 120 but also to an under layer of the fan-out part. The first voltage pads may be lengthened along one edge of the display region 'A' to which the drivers 110 and 120 are not mounted. Thus, the shape and the configuration of the first voltage pads 130 and 140 can be varied according to levels required for the driving and common voltages.

FIG. 3 illustrates an exemplary embodiment of the second substrate 200. The second substrate 200 includes the second voltage pads 210 and 220. On the entire surface of the second substrate 200, a passivation layer 230 is provided to protect the second voltage pads 210 and 220. The second substrate 200 protects a light emitting layer 10 (refer to FIG. 6) against moisture and oxygen, thereby reducing or effectively preventing deterioration of the light emitting layer.

The display device according of the illustrated embodiment is of a bottom emission type display device in which light is emitted from the light emitting layer 10 toward the back of the first substrate 100. Because the light is emitted from the light emitting layer to the back of the first substrate 100, the second voltage pads 210 and 220 are formed in a surface opposite to a direction of light emission so as not to interrupt the light emission. Therefore, the second voltage pads 210 and 220 are formed on a surface of the second substrate 200, which does not face the first substrate 100.

The second voltage pads 210 and 220 include a second common voltage pad 210 connected with the first common voltage pad 130 of the first substrate 100, and a second driving voltage pad 220 connected with the first driving voltage pad 140 of the first substrate 100.

The second common voltage pad 210 includes a first pad part 210a formed across the second substrate 200 in a short edge (e.g., transverse) direction of the second substrate 200, and a second part 210b formed in a long edge (e.g., longitudinal) direction of the second substrate 200. The second part 210b is extended from a portion of the first parts 210a extended in the long edge direction, and connected with the first common voltage pad 130 formed between the gate drivers 110 of the first substrate 100. The second common voltage pad 210 is formed to extend to the outer edges of the second substrate 200, and is electrically connected with the first common voltage pad 130 through the flexible film 320 at the edges of the second substrate 200.

The second driving voltage pad 220 is formed across the second substrate 200 in the short edge direction (e.g., transverse) of the second substrate 200 and connected with the first driving voltage pad 140 of the first substrate formed along the long edges of the display region 'A'. The second driving voltage pad 220 is formed substantially in parallel with the first part 210a of the second common voltage pad 210.

In exemplary embodiments, the first voltage pads 130 and 140, the second voltage pads 210 and 220 may be formed by patterning a metal material. This metal material may be the same materials used for the gate or data line, or ITO and IZO. In one exemplary embodiment, the second voltage pads 210 and 220 may be made of aluminum, copper, molybdenum and alloy thereof or a combination thereof. End parts of the second voltage pads 210 and 220 are formed to be connected with the first voltage pads 130 and 140, respectively. The shape and/or dimensions of the second voltage pads 210 and 220 are determined according to the configuration of the first voltage pads 130 and 140 formed on the first substrate 100, such as to correspond to the first voltage pads 130 and 140 formed on the first substrate 100.

Figure 4:
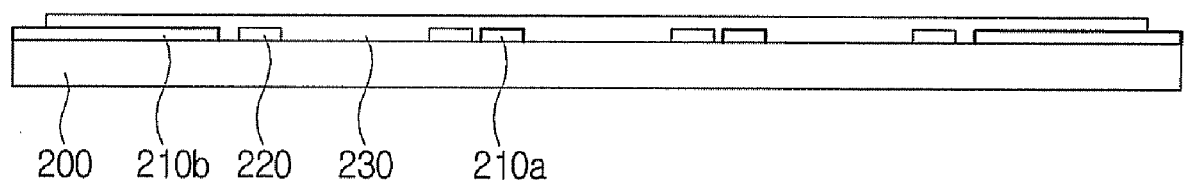
FIG. 4 is a cross-sectional view taken along line IV-IV in FIG. 3.

In FIG. 3, a dotted line shows the passivation layer 230 which protects the second voltage pads 210 and 220. FIG. 4 is a sectional view taken along line IV-IV in FIG. 3. As in the illustrated embodiment, the passivation layer 230 is formed on the entire surface of the second substrate 200 except the edges to be coupled with the flexible films 310 and 320. In an exemplary embodiment, the passivation layer 230 includes an inorganic material to reduce or effectively prevent deterioration of the metallic second voltage pads 210 and 220 due to oxygen and moisture. The passivation layer 230 may have a multi-layered structure including an organic layer. Also, the passivation layer may include a moisture-absorption layer.

Figure 5A:
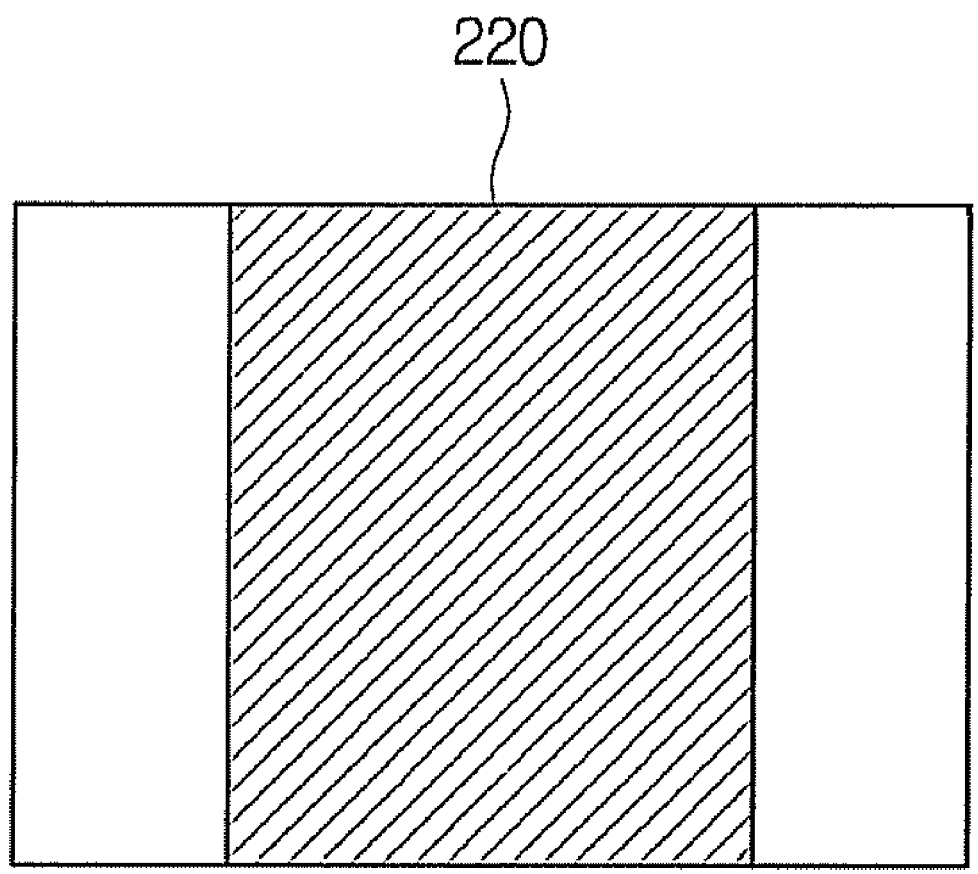
FIGS. 5A through 5C are enlarged views of exemplary embodiments of portion 'B' in FIG. 3.
Figure 5B:
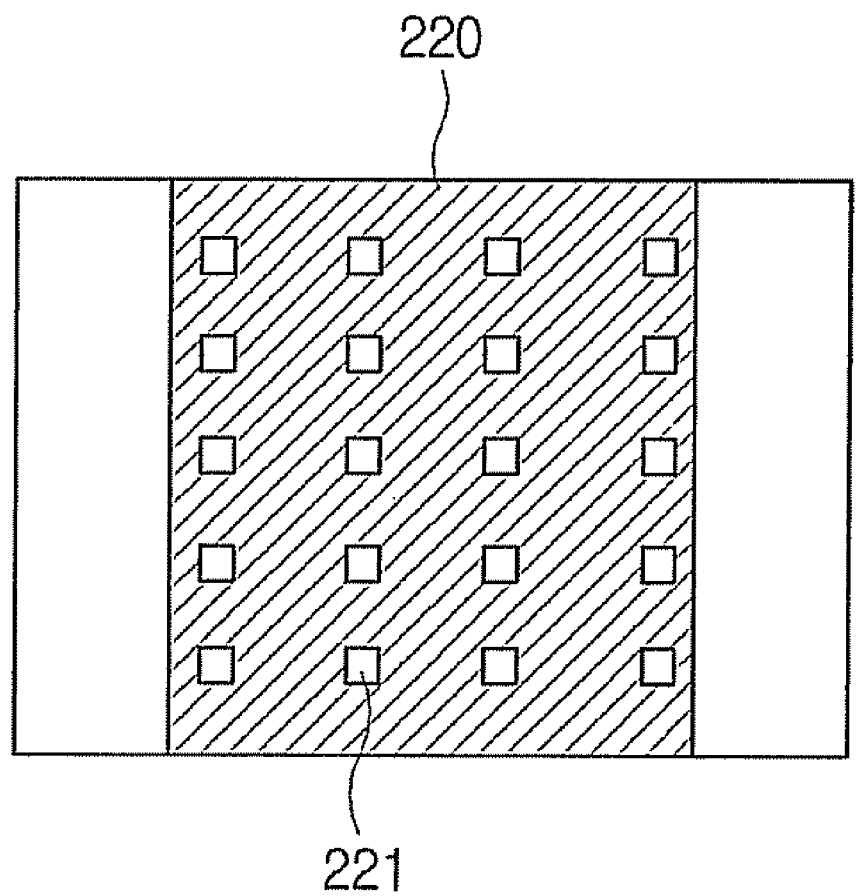
Figure 5C:
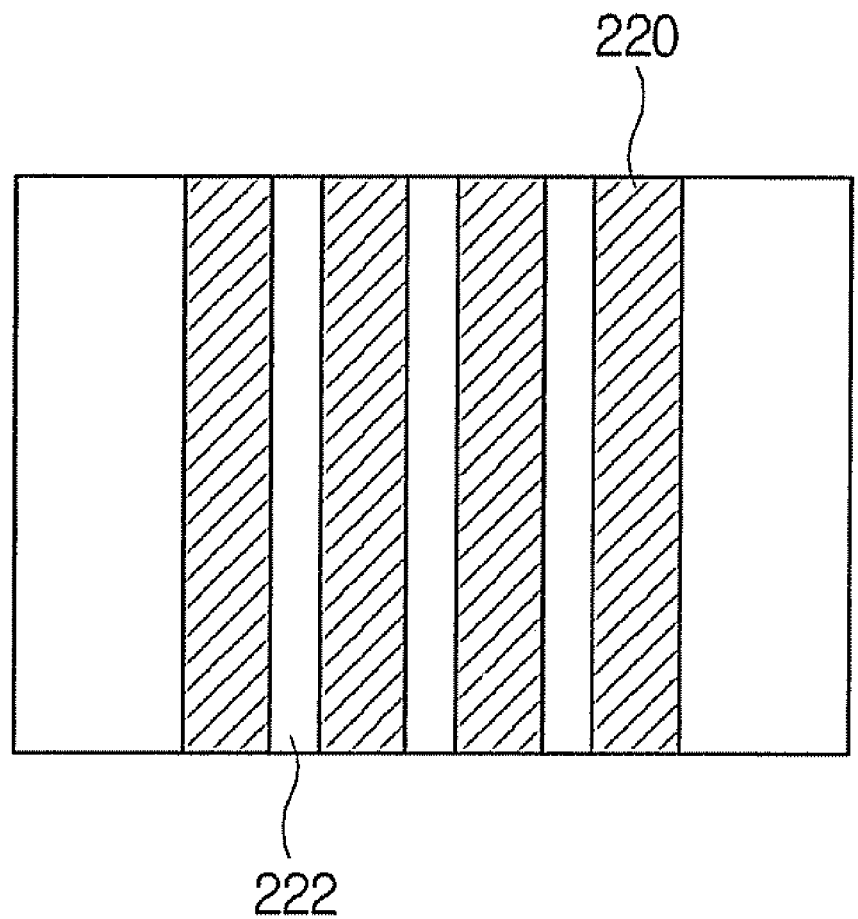

FIGS. 5A through 5C show exemplary embodiments of various shapes of the second driving voltage pad 220, as enlarged views of portion 'B' in FIG. 3. The second driving voltage pad 220 of FIG. 5A has no opening pattern, but those of FIGS. 5B and 5C have certain opening patterns 221 and 222, respectively. In FIGS. 5A through 5C, the hatched area indicates the second driving voltage pad 220.

The opening pattern of the second driving voltage pad 220 may include any of a number of shapes and arrangements. As in the illustrated embodiment of FIG. 5B, the opening pattern 221 includes discrete openings arranged within the second driving voltage pad 220. The openings are rectilinear, but the invention is not limited thereto. The discrete openings may also include a curved shape. The opening pattern 222 of FIG. 5C includes a continuous opening extending along a longitudinal direction of the second driving voltage pad 220.

While coupling the first substrate 100 including the light emitting layer 10 with the second substrate 200 protecting the same, a blocking layer 500 (refer to FIG. 6) is provided between the two substrates 100 and 200 to block the moisture and oxygen. In exemplary embodiments, such a blocking layer may include a thermosetting resin or an ultraviolet ("UV")-setting resin.

Referring again to FIGS. 5B and 5C, the opening patterns 221 and 222 may be used for minimizing a UV blocked area by the second voltage pads 210 and 220 when two substrates are hardened by UV rays through the hardening of blocking layer. In other words, because the UV rays can be blocked by the metallic second voltage pads 210 and 220, the certain opening patterns 221 and 222 are made when forming the second voltage pads 210 and 220, thereby reducing or minimizing the UV block.

In FIG. 5B grid-shaped openings are formed on the second driving voltage pad 220, and in FIG. 5C stripe-shaped openings are formed on one second driving voltage pad 220. However, the opening patterns may be varied in shape. Alternatively, when the blocking layer is hardened by heat or when the blocking layer is exposed to the UV rays from the back of the first substrate 100, the second driving voltage pad 220 may have no opening like that shown in FIG. 5A.

Referring again to FIG. 1, the first and second substrates 100 and 200 as illustrated in FIGS. 2 and 3, respectively, are coupled with each other to form the display device. The power supply 400 and the flexible films 310 and 320 are coupled to the first substrate 100, thereby completing the display device of FIG. 1.

The power supply 400 is connected to one side of the first substrate 100 provided with the data driver 120 and supplies a gate voltage and a data voltage to the display region 'A'. The power supply 400 may include a power generator generating various voltages and/or a circuit generating the voltages mounted with a. After forming the display region 'A' on the first substrate 100, the power supply 400 may be folded onto the rear of the display region 'A'. In one exemplary embodiment, the power supply 400 can be achieved by a flexible film. A gate on/off voltage is supplied to the gate driver 110 through a wiring pattern (not shown) formed on the first substrate 100.

As in the illustrated embodiment, the flexible films 310 and 320 include a power supply flexible film 310 connected to the power supply 400 and supplying various voltages and a connection flexible film 320 connecting the first voltage pads 130 and 140 with the second voltage pads 210 and 220.

Referring to FIGS. 1 and 2, the power supply flexible film 310 has one end connected to the power supply 400, and the other end connected to the first voltage pads 130 and 140 provided between the data drivers 120 of the first substrate 100. The driving voltage and the common voltage are supplied through only the first driving voltage pad 140 and the first common voltage pad 130 formed between the data drivers 120, respectively. The common voltage and the driving voltage are supplied to one side of the display region 'A', and transferred to the other sides (e.g., opposite and adjacent sides) of the first substrate 100 by the second voltage pads 210 and 220 formed on the second substrate 200.

As in the illustrated embodiment, the common voltage and the driving voltage are substantially supplied through one side of the display region 'A', but the common voltage and the driving voltage are effectively supplied to all sides of the display region 'A' because the one side of the display region 'A' is connected to first voltage pads 130 and 140 disposed across the display region 'A' through the second voltage pads 210 and 220. Advantageously, the driving voltage and the common voltages are supplied through more parts, and accordingly the brightness of the display device is improved in uniformity.

Figure 6:
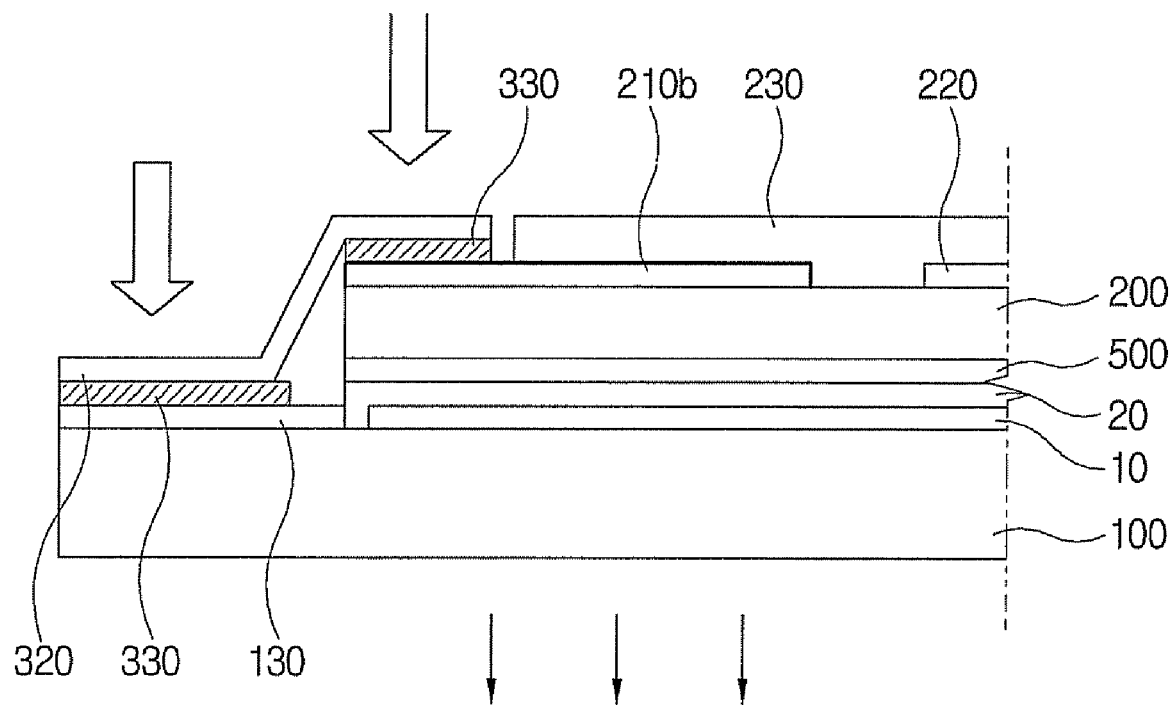
FIG. 6 is a cross-sectional view taken along line VI-VI in FIG. 1.

The connection flexible film 320 connects two voltage pads, e.g., pairs 130 and 210 and 140 and 220, formed on different substrates 100 and 200, respectively. As shown in FIG. 6, a conductive film 330, such as an anisotropic conductive film, is formed on portions of voltage pads 130 and 210b contacting the connection flexible film 320 and formed between the voltage pad and the flexible film. The anisotropic conductive film 330 facilitates electric-contact efficiency between the voltage pads 130 and 210b, and absorbs an impact from the outside.

In one exemplary embodiment, The first common voltage pad 130 and the second common voltage pad 210b may be connected by disposing the anisotropic conductive films 330 and the connection flexible film 320 on the first common voltage pad 130, and pressing down the connection flexible film 320, such as is shown by the upper downward arrows in FIG. 6.

The display device of the illustrated embodiment is of a bottom emission type display device in which light is emitted from the light emitting layer 10 toward the bottom of the first substrate 100, such as indicated by the lower downward arrows of FIG. 6. The lighted is emitted toward a rear surface of the first substrate 100 on which the light emitting layer 10 is not formed. On a top surface of the light emitting layer 10, an opaque common electrode 20 is formed on a whole of the display region 'A'. The blocking layer 500 is interposed between the common electrode 20 and the second substrate 200. In an exemplary embodiment, such as to not interrupt light, the second common voltage pad 210 is partially overlapped with the display region 'A' and is formed on the common electrode 20, e.g., on the second substrate 200.

In an exemplary embodiment, the drivers 110 and 120 and the first voltage pads 130 and 140 may be formed on a single surface of the first substrate 100, e.g., on the same layer as the light emitting layer 10. When the display device is the bottom emission type display device, the connection flexible film 320 can connect two voltage pads 130 and 210b without being folded onto an other surface of the first substrate 100. Advantageously, since the connection flexible film 320 is not folded, voltage is relatively quickly supplied and resistance is decreased.

The blocking layer 500 may include an organic and/or inorganic material. The blocking layer is interposed between the first substrate 100 and the second substrate 200. The blocking layer 500 protects the light emitting layer 10 against moisture and oxygen, and adheres two substrates 100 and 200 to each other. In one exemplary embodiment, the blocking layer 500 may include a material to be hardened by heat or UV rays.

Figure 7:
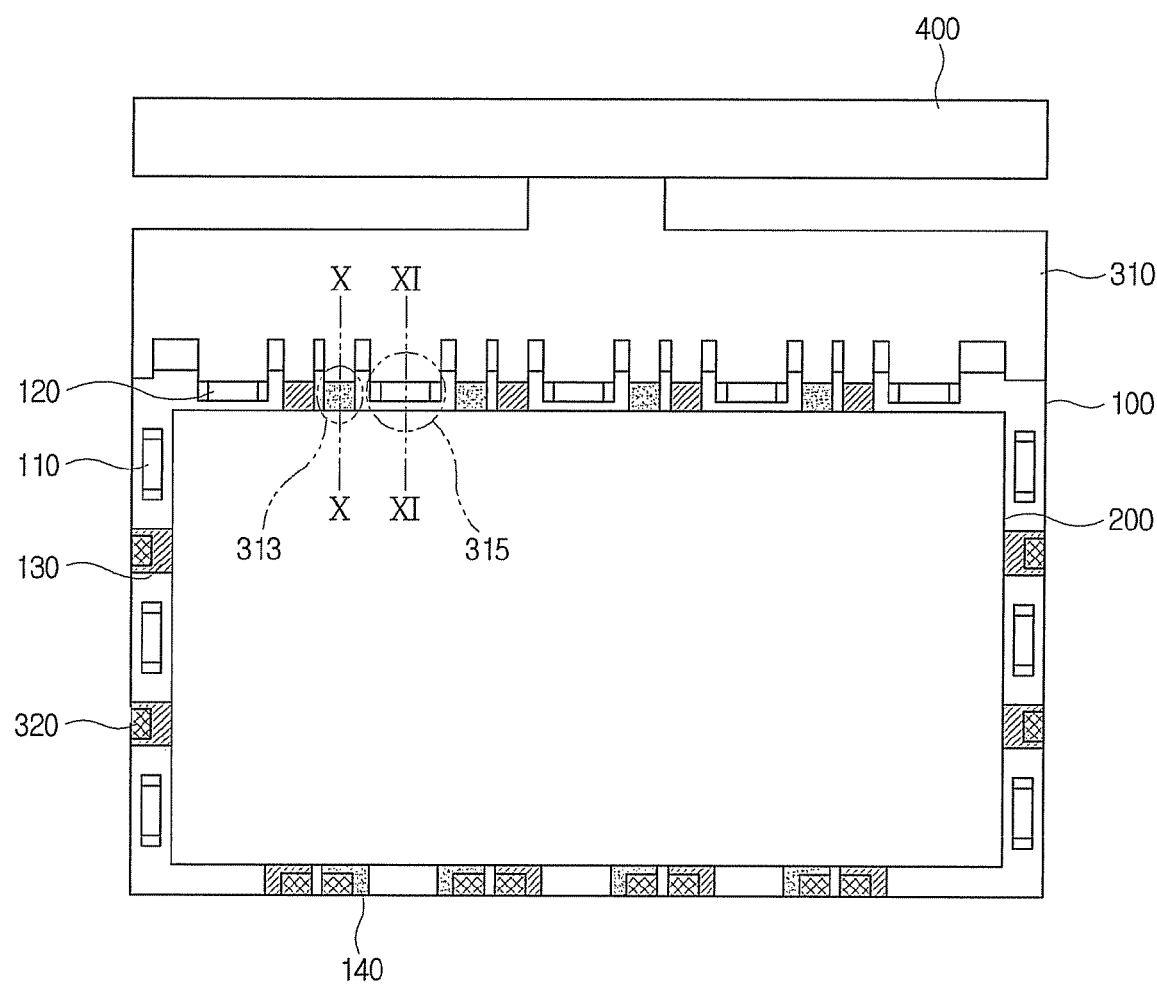
FIG. 7 is a schematic view of another exemplary embodiment of a display device according to the present invention.
Figure 8:
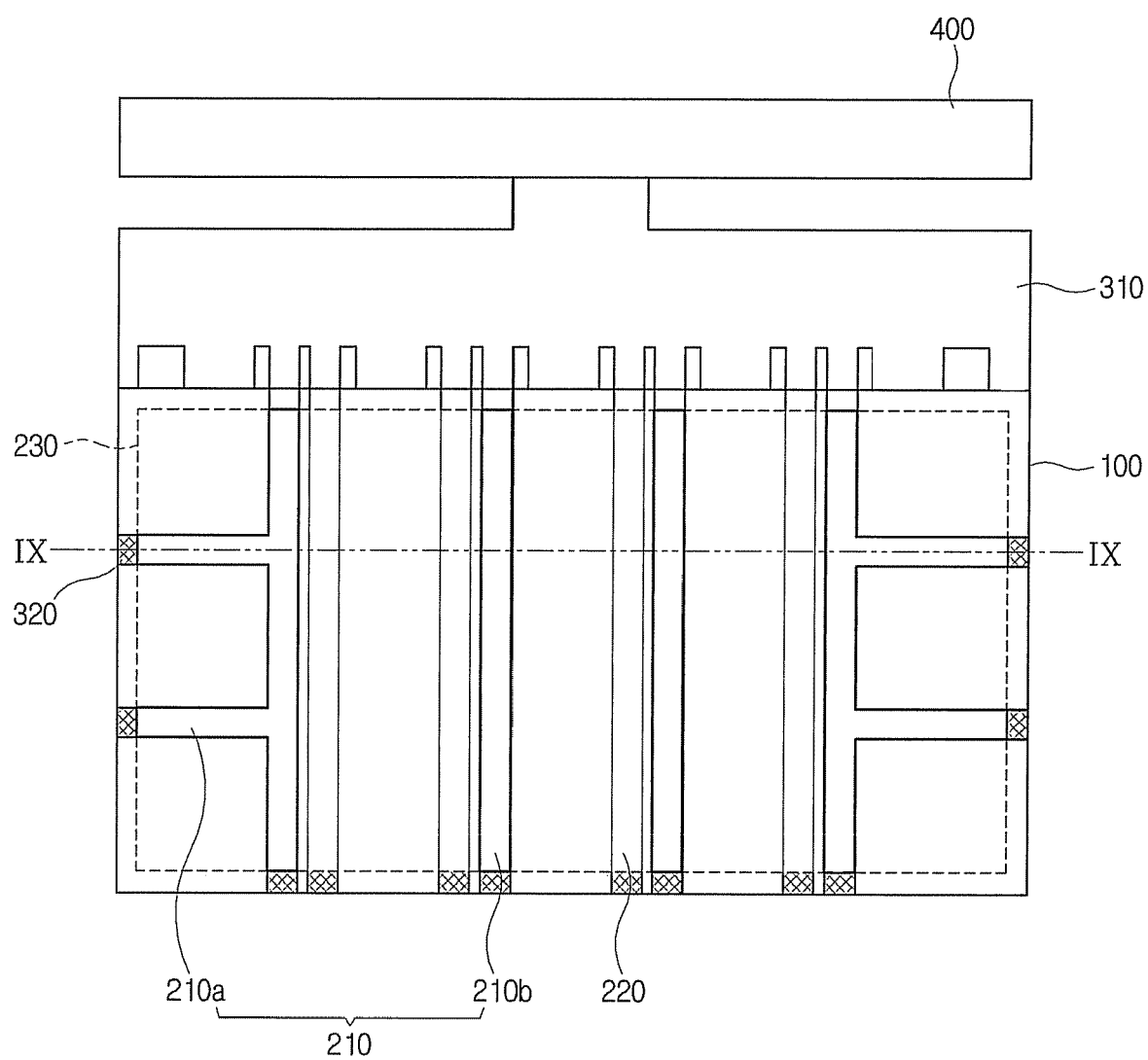
FIG. 8 is a rear view of the display device in FIG. 7.

FIG. 7 is a schematic view of another exemplary embodiment of a display device according to the present invention, and FIG. 8 is a rear view of the display device in FIG. 7. A display device of the illustrated embodiment includes second voltage pads 210 and 220 formed on a back side of a first substrate 100. When the display device is viewed from the top of a second substrate 200, such as in FIG. 7, the second voltage pads 210 and 220 are not shown.

First voltage pads 130 and 140 of the illustrated embodiment are formed like those in FIGS. 1-3. The second voltage pads 210 and 220 are formed on the back of the first substrate 100 as shown in FIG. 8. The shape and the configuration of the second voltage pads 210 and 220 are substantially the same as those formed on the second substrate 200 in FIGS. 1-3. In more detail, the second voltage pads 210 are formed to overlap with a display region 'A', and are arranged such that an end thereof is connected with the first voltage pads 130 and 140, respectively. A passivation layer 230 is formed on the second voltage pads 210 and 220 and protects the second voltage pads 210 and 220 from the outside.

A power supply flexible film 310 is connected to a data driver 120 and to the first common voltage pad 130 and the first driving voltage pad 140 which are formed between the data drivers 120. The power supply flexible film 310 includes a power supply region 313 connected to the first voltage pads 130 and 140, and a driver region 315 connected to the data driver 120. A connection flexible film 320 connects the first and second voltage pads 130, 140, 210 and 220 at an edge portion of the first substrate 100.

Figure 9:
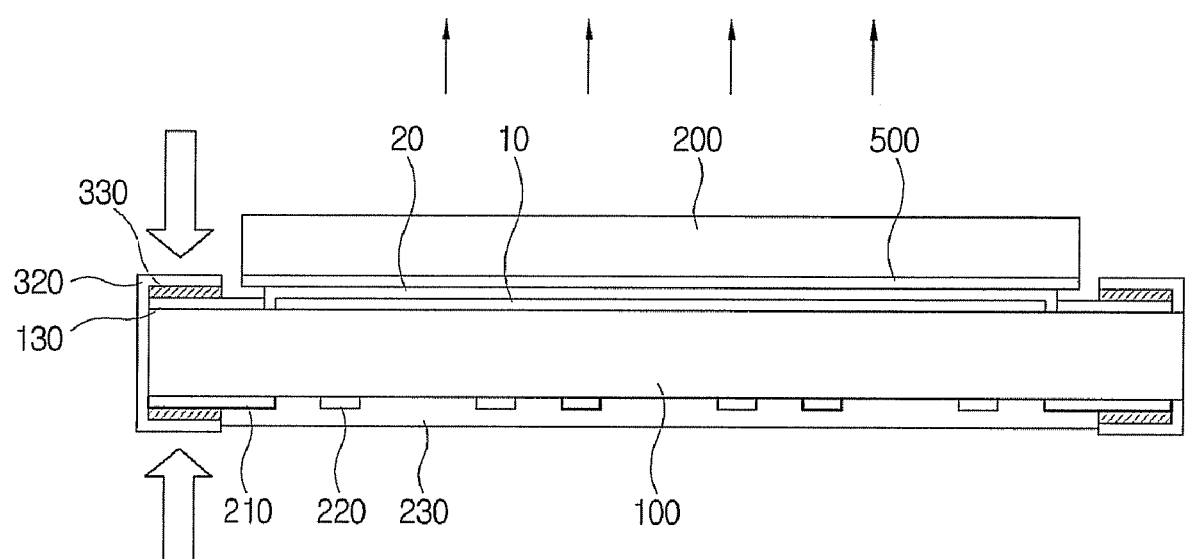
FIG. 9 is a cross-sectional view taken along line IX-IX in FIG. 8.

FIG. 9 is a cross-sectional view taken along line IX-IX in FIG. 8. The display device illustrated is an exemplary embodiment of a top emission type display device as indicated by the upward directed arrows above the display device. A light emitting layer 10, a common electrode 20, a blocking layer 500 and the second substrate 200 are disposed on a surface of the first substrate 100, e.g., an upper surface. The first common voltage pad 130 is formed at an edge portion of the first substrate 100 and on same surface as the light emitting layer 10, a common electrode 20 and a blocking layer 500.

The second common voltage pad 210 connected to the first common voltage pad 130, and the second driving voltage pad 220 are disposed on another surface of the first substrate 100, e.g., on a lower surface or a rear of the first substrate 100 on which the light emitting layer 10 is not formed. The rear surface of the first substrate 100 is considered as opposing the upper surface.

As illustrated in FIG. 9, the connection flexible film 320 is bent around an outer edge of and surrounding the first substrate 100, thereby connecting the voltage pads 130 and 210 formed on the opposing surfaces of the first substrate 100. Through this structure of the connection flexible film 320, the voltage pads 130 and 210 placed in an edge portion of the substrate 100 are relatively simply electrically connected with each other. In an exemplary embodiment, between the connection flexible film 320 and the voltage pads 130 and 210 may be provided an isotropic conductive film 330.

The light emitting layer 10 emits light from a surface of the first substrate 100, e.g., an upper or emitting surface, on which the second voltage pads 210 and 220 are not disposed and towards the second substrate 200. In a top emission type display device, elements provided on the first substrate 100 have essentially no effect on a traveling path of the light. As in the illustrated embodiment of FIG. 9, the top emission type display device includes the second voltage pads 210 and 220 formed on the rear of the first substrate 100, while elements of the first substrate 100 are provided an a front surface thereof. As used herein, "elements" refers to any of a number of features of the display device of the illustrated embodiments, such as the drivers, voltage pads, etc.

In one exemplary embodiment, the first common voltage pad 130 and the second common voltage pad 210 may be connected by disposing the anisotropic conductive films 330 and the connection flexible film 320 on the first common voltage pad 130 and the second common voltage pads 210, and applying a force to the connection flexible film 320, such as is shown by the opposing arrows in FIG. 9. The anisotropic conductive films 330 and the connection flexible film 320 are disposed on opposing sides of the first substrate 100.

Figure 10:
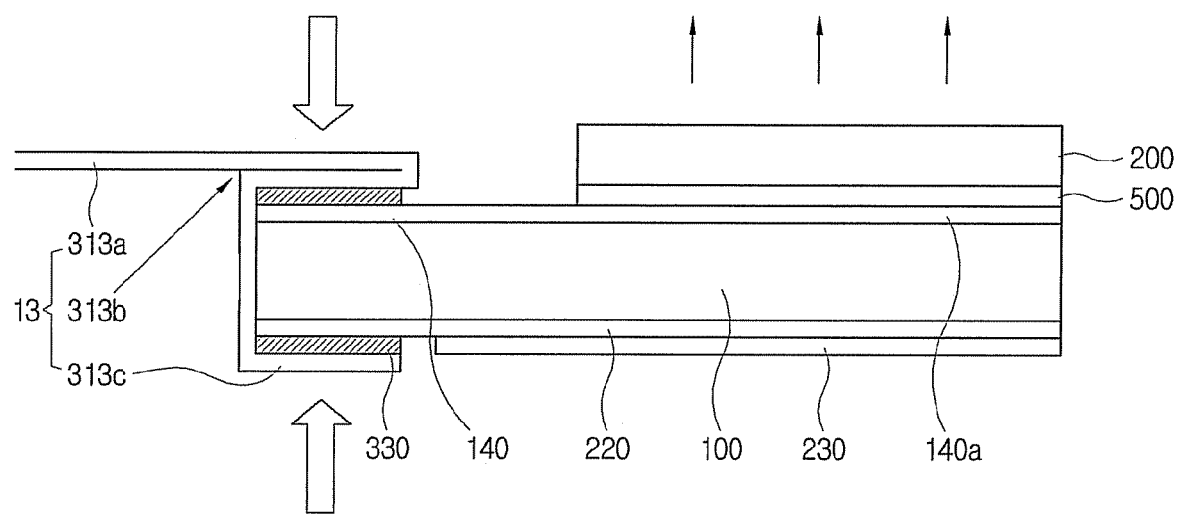
FIG. 10 is a cross-sectional view taken along line X-X in FIG. 7.
Figure 11:
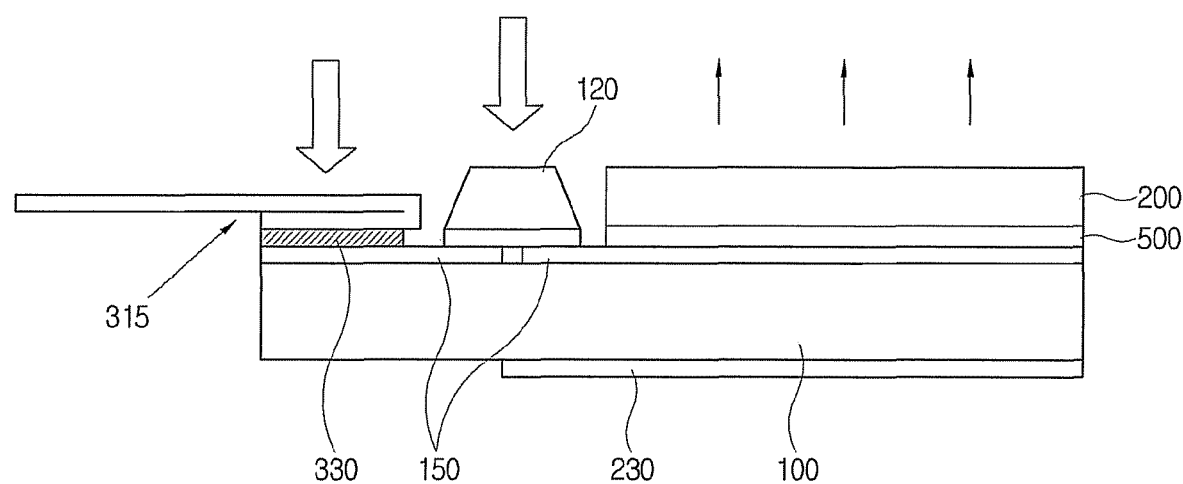
FIG. 11 is a cross-sectional view taken along line XI-XI in FIG. 7.

FIG. 10 is a cross-sectional view taken along line X-X in FIG. 7, which illustrates an exemplary embodiment of a power supply region 313 of the power supply flexible film 310. FIG. 11 is a cross-sectional view taken along line XI-XI in FIG. 7, which illustrates an exemplary embodiment of a driver region 315 of the power supply flexible film 310.

Referring to FIG. 10, the power supply region 313 includes a first connection part 313a connected to the power supply 400, a second connection part 313b extended from the first connection part 313a and contacting the first driving voltage pad 140, and a third connection part 313c bent from the second connection part 313b and contacting the second driving voltage pad 220. The first through third connection parts 313a through 313c and the power supply flexible film 310 are formed as a single or integral body, but reference numerals are given to these certain parts for convenience of description. As used herein, "integral" is used to indicated formed to be a single unit or piece rather than combining separate parts. The first driving voltage pad 140 is extended in the non-display region from the driving voltage line 140a in the display region.

To use a single piece, such as a sheet, of a flexible film for connecting the power supply 400 and two pads 140 and 220 formed the opposing surfaces of one substrate 100, the second connection part 313b may be formed to have a double-layered structure. As illustrated in FIG. 10, the flexible film 310 is bent back on itself to form the first and second connection parts 313a and 313b.

Alternatively, if the second connection part 313b does not have the double-layered structure, multiple pieces such as at least two sheets of the flexible film may be needed to connect the power supply 400 and the first driving voltage pad 140 and to connect the first driving voltage pad 140 and the second driving voltage pad 220. As more sheets of flexible films are used, voltage drop due to resistance and production cost may be increased. As in the illustrated embodiments, a single piece flexible film is used for connecting three elements or parts, thereby reducing the production cost, minimizing the voltage drop and making the display device relatively slim.

The second connection part 313b and the third connection part 313c are formed with the anisotropic conductive film 330 so as to contact with the voltage pads 140 and 220. In an exemplary embodiment, the power supply flexible film 310 is connected to the first substrate 100 by pressing from above and below the first substrate 100, such as is shown by the opposing arrows in FIG. 10.

FIG. 10 illustrates only the first and second driving voltage pads 140 and 220, but the first and second common voltage pads 130 and 210 can be connected to the power supply flexible film 310 by the same structure.

In FIG. 11, the driver region 315 is used for connecting the data driver 120 to the power supply 400. The data driver 120 contacts a data metal layer 150 formed on a surface, e.g., upper surface, of the first substrate 100. The driver region 315 also contacts the data metal layer 150. As in the illustrated embodiment, the power supply 400 supplies a predetermined voltage to the display region 'A' of the first substrate 100 through the driver region 315 and the data driver 120 which are in contact with the data metal layer 150.

In an exemplary embodiment, the driver region 315 includes a double-layered structure. The power supply region 313 and the driver region 315 may be formed on a same side of the first substrate 100 and have substantially the same height in a direction perpendicular to the first substrate 100, such that the power supply flexible film 310 is more readily coupled to the first substrate 100.

In an alternative embodiment, when folding of the power supply flexible film 310 is not necessary in the driver region 315, the flexible film 310 may be formed by a single-layered structure. A single-layered construction of the flexible film 310 in the driver region 315 may lead a difference in an overall thickness (e.g., in a direction perpendicular to the first substrate 100 at the driver region 315) of power supply flexible film 310 from that of the power supply region 313, needing a folded flexible film 310. Where the overall thickness of the power supply region 313 and the driver region 315 are different, the attaching or pressing process may be performed more than once, such as twice, and/or applied pressure should be varied. Consequently, it is preferable that the driver region 315 has the double-layered structure to connect the power supply flexible film 310 with the first substrate 100 allowing a same pressure to be applied thereto a least amount of times, such as once.

In the illustrated embodiments, the connection flexible film 320 is formed to have a single-layered structure, but not limited thereto. Alternatively, the connection flexible film 320 may be formed to have a double-layered structure, such that the power supply flexible film 310 and the connection flexible film 320 can be connected to the first substrate 100 through one pressing process.

As described above, the present invention provides a display device and a method of fabricating the same, in which driving voltage and common voltage are supplied smoothly, thereby getting uniform brightness.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device comprising:
   a first substrate including a display region;
   a light emitting layer disposed on the display region;
   a first voltage pad disposed outside the display region, on the first substrate outside of the display region and supplying a predetermined voltage to the display region;
   a second substrate provided above the first substrate and corresponding to the display region;
   a second voltage pad disposed on one of the first or the second substrate opposite to a direction of light emitted from the light emitting layer, and disposed on a surface of the one of the first or second substrate, the surface being opposite to the direction of light emitted from the light emitting layer; and
   a flexible film electrically connecting the first voltage pad and the second voltage pad.

2. The display device according to claim 1, further comprising an anistropic conductive film provided between the flexible film and the first voltage pad, and the flexible film and the second voltage pad.

3. The display device according to claim 1, further comprising a passivation layer disposed on a portion of the second voltage pad.

4. The display device according to claim 1, wherein the second voltage pad comprises an opening pattern.

5. The display device according to claim 1, wherein the first voltage pad is plurally provided, and
   a voltage having a first level is applied to a portion of the first voltage pads and a voltage having a second level different from the first level is applied to a remaining portion of the first voltage pads.

6. The display device according to claim 5, wherein the first voltage pad comprises a first common voltage pad to which a common voltage having the first level is applied, and a first driving voltage pad to which a driving voltage having the second level is applied.

7. The display device according to claim 6, wherein the second voltage pad comprises a second common voltage pad connected to the first common voltage pad, and a second driving voltage pad connected to the first driving voltage pad.

8. The display device according to claim 6, further comprising a driving voltage line disposed within the display region,
   wherein the first driving voltage pad is connected to the driving voltage line.

9. The display device according to claim 6, further comprising a common electrode disposed on a whole of the display region,
   wherein the first common voltage pad is connected to the common electrode.

10. The display device according to claim 9, further comprising a blocking layer interposed between the common electrode and the second substrate.

11. A display device comprising:
    a first substrate including a display region;
    a light emitting layer disposed on the display region;
    at least two first voltage pads disposed on the first substrate and outside of the display region, and supplying a predetermined voltage to the display region;
    a second substrate provided above the first substrate and corresponding to the display region;
    at least two second voltage pads disposed on a surface of the second substrate opposite to a direction of light emitted from the light emitting layer; and
    a flexible film connecting the first voltage pads and the second voltage pad.

12. The display device according to claim 11, further comprising an anistropic conductive film provided between the flexible film and the first voltage pads and the second voltage pad.

13. The display device according to claim 11, wherein the second voltage pad is disposed on a surface of the second substrate which does not face the first substrate.

14. The display device according to claim 11, further comprising a passivation layer disposed on a portion of the second voltage pad.

15. A display device comprising:
    a first substrate including a first surface including a display region;
    a light emitting layer disposed within the display region;
    at least two first voltage pads disposed on the first substrate, outside of the display region and supplying a predetermined voltage to the display region;
    a second voltage pad disposed on a second surface of the first substrate opposite to the first surface;
    a flexible film electrically connecting the first voltage pads and the second voltage pad; and
    a second substrate provided above the first substrate and corresponding to the display region.

16. The display device according to claim 15, wherein the second surface is opposite to a direction of light emitted from the light emitting layer.

17. The display device according to claim 15, further comprising:
    a power supply outputting voltage supplied to the first voltage pads;
    a data line disposed within the display region;
    a plurality of data drivers mounted outside of the display region and applying data voltage to the data line; and
    a power supply flexible film connecting the first voltage pads and the power supply,
    wherein the power supply flexible film comprises:
        a power supply region including a first connection part connected to the power supply, a second connection part extended from the first connection part and contacting the first voltage pads, and a third connection part bent from the second connection part and contacting the second voltage pad; and
        a driver region connecting the data drivers and the power supply.

18. The display device according to claim 17, wherein the second connection part and the driver region are formed having a double-layered structure.

19. A method of fabricating a display device, the method comprising:
forming a first substrate including a display region, a light emitting layer and a first voltage pad supplying a predetermined voltage to the display region;
forming a second voltage pad on a first surface of a second substrate and forming a passivation layer on the second voltage pad;
forming a blocking layer on the first substrate or a second surface of the second substrate opposite to the first surface;
hardening the blocking layer after adhering the second substrate onto the display region of the first substrate; and
connecting the first voltage pad with the second voltage pad through a flexible film.

20. The method according to claim 19, wherein the first voltage pad comprises a first common voltage pad to which a common voltage is applied, and a first driving voltage pad to which a driving voltage is applied, and
the second voltage pad comprises a second common voltage pad connected to the first common voltage pad, and a second driving voltage pad connected to the first driving voltage pad.

21. A method of fabricating a display device, the method comprising:
forming a display region including a plurality of transistors and a first voltage pad supplying a predetermined voltage to the display region on a first surface of a first substrate;
forming a second voltage pad on a second surface of the first substrate opposite to the first surface and a passivation layer on the second voltage pad;
forming a light emitting layer on the display region;
forming a blocking layer on the first surface of the first substrate including the light emitting layer and at least one surface of the second substrate;
hardening the blocking layer after adhering the second substrate onto the display region of the first substrate; and
connecting the first voltage pad with the second voltage pad through a flexible film.

22. The method according to claim 21, wherein the connecting the first voltage pad with the second voltage pad comprises:
forming an anisotropic conductive film on the first voltage pad and the second voltage pad; and
applying a force to the flexible film after spreading the flexible film on the anisotropic conductive film.

* * * * *